United States Patent
Chiba et al.

(10) Patent No.: US 12,362,142 B2
(45) Date of Patent: Jul. 15, 2025

(54) PLASMA PROCESSING METHOD AND SUBSTRATE PROCESSING APPARATUS

(71) Applicant: Tokyo Electron Limited, Tokyo (JP)

(72) Inventors: Takashi Chiba, Iwate (JP); Jun Sato, Iwate (JP); Takeshi Kobayashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 57 days.

(21) Appl. No.: 18/317,353

(22) Filed: May 15, 2023

(65) Prior Publication Data

US 2023/0402256 A1 Dec. 14, 2023

(30) Foreign Application Priority Data

Jun. 9, 2022 (JP) ................................ 2022-093959

(51) Int. Cl.

| | | |
|---|---|---|
| *C23C 16/00* | (2006.01) | |
| *C23C 16/30* | (2006.01) | |
| *C23C 16/34* | (2006.01) | |
| *C23C 16/36* | (2006.01) | |
| *C23C 16/455* | (2006.01) | |
| *C23C 16/458* | (2006.01) | |
| *C23C 16/505* | (2006.01) | |
| *H01J 37/32* | (2006.01) | |

(52) U.S. Cl.
CPC ...... *H01J 37/32146* (2013.01); *C23C 16/308* (2013.01); *C23C 16/345* (2013.01); *C23C 16/36* (2013.01); *C23C 16/45536* (2013.01); *C23C 16/4584* (2013.01); *C23C 16/505* (2013.01); *H01J 37/3211* (2013.01); *H01J 2237/201* (2013.01); *H01J 2237/20214* (2013.01); *H01J 2237/332* (2013.01)

(58) Field of Classification Search
CPC ................ C23C 16/34; C23C 16/4412; C23C 16/45538; C23C 16/45551
See application file for complete search history.

(56) References Cited

U.S. PATENT DOCUMENTS

2009/0194508 A1* 8/2009 Ui ..................... H01J 37/32045
156/345.24

FOREIGN PATENT DOCUMENTS

| JP | 2013-135154 | 7/2013 | |
| JP | 2013135154 A | * 7/2013 | ........... C23C 16/045 |

OTHER PUBLICATIONS

JP-2013135154-A English translation. (Year: 2013).*

* cited by examiner

*Primary Examiner* — Hai Y Zhang
(74) *Attorney, Agent, or Firm* — IPUSA, PLLC (57) ABSTRACT

With respect to a plasma processing method of depositing a nitride film on a substrate by using plasma, the plasma processing method includes (a) supplying a plasma processing gas that includes a nitrogen-containing gas to a plasma processing space inside a processing container, and (b) supplying high-frequency power from a high-frequency power supply to an antenna disposed on a quartz portion exposed to the plasma processing space to generate the plasma in the plasma processing space at a time of performing (a). (b) includes supplying a pulse wave of the high-frequency power to the antenna. The pulse wave repeats on and off.

5 Claims, 9 Drawing Sheets

PLASMA PROCESSING METHOD AND SUBSTRATE PROCESSING APPARATUS

CROSS-REFERENCE TO RELATED APPLICATIONS

This patent application is based on and claims priority to Japanese Patent Application No. 2022-093959 filed on Jun. 9, 2022, the entire contents of which are incorporated herein by reference.

TECHNICAL FIELD

The present disclosure relates to a plasma processing method and a substrate processing apparatus.

BACKGROUND

Patent Document 1 discloses a plasma processing method (a film deposition method) for depositing a silicon oxide film on a surface of a substrate by generating plasma in an internal space of a processing container. In this plasma processing method, plasma is generated in the internal space by supplying an argon gas, an oxygen gas, an ammonia gas, and the like into the internal space of the processing container and supplying high-frequency power to an antenna disposed at an upper portion of the internal space.

RELATED ART DOCUMENT

[Patent Document]
[Patent Document 1] Japanese Laid-open Patent Application Publication No. 2013-135154

SUMMARY

According to an aspect of the present disclosure, with respect to a plasma processing method of depositing a nitride film on a substrate by using plasma, the plasma processing method includes (a) supplying a plasma processing gas that includes a nitrogen-containing gas to a plasma processing space inside a processing container, and (b) supplying high-frequency power from a high-frequency power supply to an antenna disposed on a quartz portion exposed to the plasma processing space to generate the plasma in the plasma processing space at a time of performing (a). (b) includes supplying a pulse wave of the high-frequency power to the antenna. The pulse wave repeats on and off.

DETAILED DESCRIPTION OF EMBODIMENTS

Nitrogen (N) that is contained in an ammonia gas supplied to generate plasma becomes active species by being affected by high-energy electrons ionized in an internal space. The active species of nitrogen may damage quartz.

In the following, embodiments of the present disclosure will be described with reference to the drawings. In the drawings, the same components are denoted by the same reference numerals, and duplicated description may be omitted.

Figure 1:
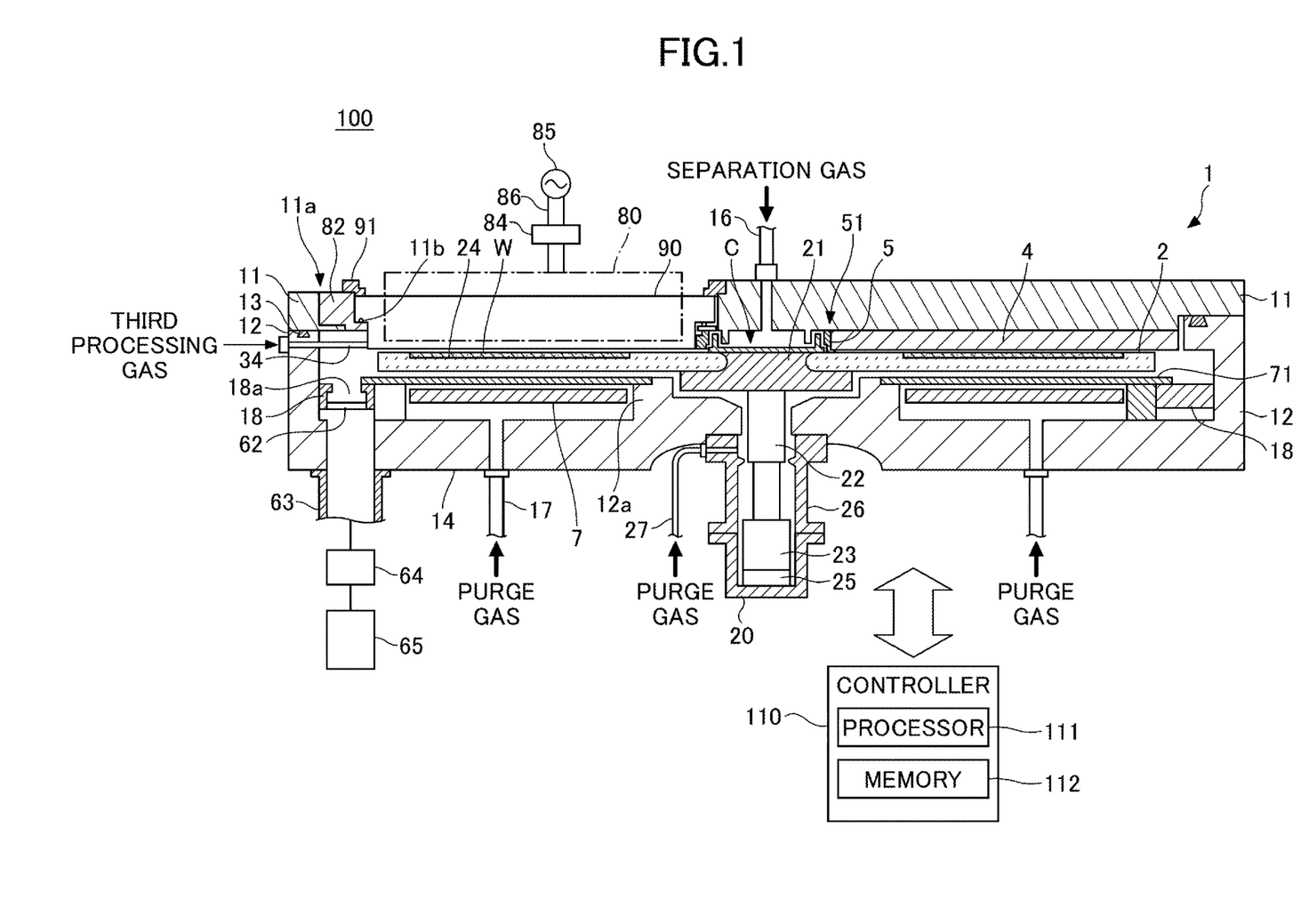
FIG. 1 is a schematic cross-sectional view illustrating a configuration example of a substrate processing apparatus according to an embodiment.
Figure 2:
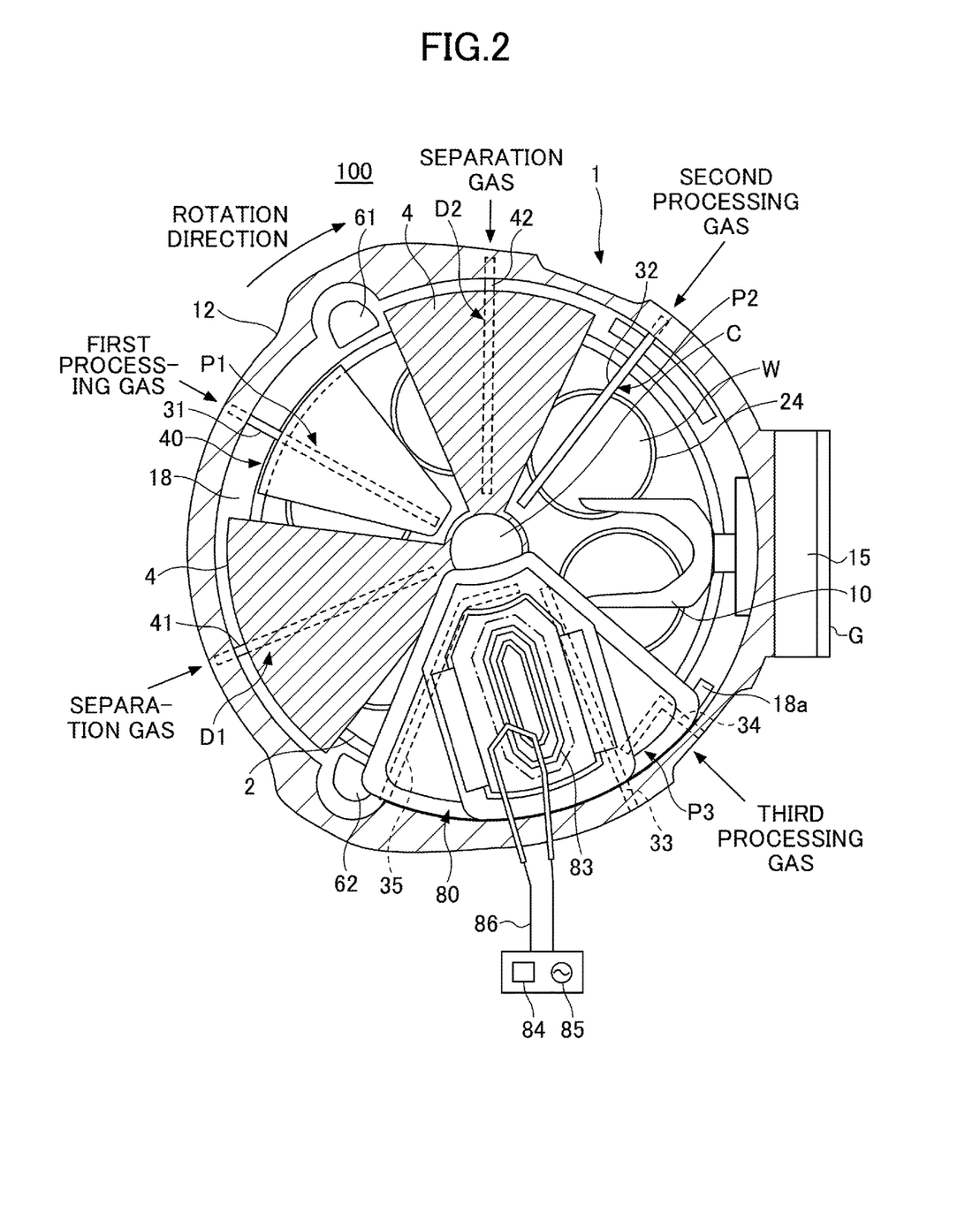
FIG. 2 is a schematic plan view of the substrate processing apparatus of FIG. 1.

FIG. 1 is a schematic cross-sectional view illustrating a configuration example of a substrate processing apparatus 100 according to an embodiment. FIG. 2 is a schematic plan view of the substrate processing apparatus 100 illustrated in FIG. 1. In FIG. 2, a top plate is not illustrated for convenience of explanation. A plasma processing method according to the embodiment deposits a predetermined film on a surface of a substrate, using the substrate processing apparatus 100 illustrated in FIG. 1 and FIG. 2. The substrate processing apparatus 100 performs a film deposition process by an atomic layer deposition (ALD) method or a molecular layer deposition (MLD) method.

Examples of the substrate on which the film deposition process is performed include a semiconductor wafer, such as a silicon semiconductor, a compound semiconductor, an oxide semiconductor, or the like (hereinafter, the substrate is also referred to as a wafer W). The wafer W may have a recess pattern such as a trench or a via.

Additionally, in the plasma processing method according to the present embodiment, a silicon oxynitride (SiON: $SiO_xN_y$) film is deposited on the surface of the wafer W. Here, as long as the plasma processing method is a film deposition process of depositing a nitride film, the type of the film to be deposited is not limited to the SiON film, and may be, for example, a SiN film, a SiCN film, a SiBCN film, a SiOCN film, or the like.

As illustrated in FIG. 1, the substrate processing apparatus 100 includes a substantially cylindrical processing container 1 and a rotary table 2 (a substrate support) configured to rotate (revolve) the wafer W in the processing container 1. Additionally, the substrate processing apparatus 100 includes a controller 110 configured to control each component of the substrate processing apparatus 100.

The processing container 1 accommodates multiple wafers W inside the processing container 1 and forms a SiON film on each wafer W. The processing container 1 includes a top plate 11 and a container body 12, and has a processing chamber for accommodating the multiple wafers W and forming the SiON film on each wafer W. The processing container 1 includes an annular seal member 13 on an outer circumferential wall of an upper surface of the container body 12, and the top plate 11 can be detachably and hermetically fixed to the container body 12. The diameter (the inside diameter) of the processing container 1 in a plan view may be designed to be, for example, about the 1100 mm.

A separation gas supply pipe 16 for supplying a separation gas is connected to a central portion of the top plate 11. A purge gas supply pipe 17 for supplying a purge gas such as an Ar gas is connected to a bottom 14 of the container body 12. Multiple purge gas supply pipes 17 are provided along the circumferential direction of the bottom 14. Additionally, the bottom 14 has an annular protrusion 12a at a position close to an outer circumferential surface of a core 21 to which the rotary table 2 is fixed.

A transfer port 15 for transferring the wafer W between the rotary table 2 and a transfer arm 10 and a gate valve G for opening and closing the transfer port 15 are provided at an outer circumferential wall of the processing container 1 (see FIG. 2). The gate valve G hermetically seals the processing chamber of the processing container 1 in a closed state of the transfer port 15. A recess 24 on which the wafer W is placed is disposed at a position adjacent to the transfer port 15, and the wafer W is transferred between the rotary table 2 and the transfer arm 10.

The rotary table 2 accommodated in the processing container 1 is fixed to the substantially disk-shaped core 21 at a central portion of the processing container 1 (see FIG. 1). The core 21 is connected to a rotation shaft 22 extending in the vertical direction, and the rotation shaft 22 is supported by a driving section 23. The driving section 23 rotates the rotary table 2 about the vertical axis (clockwise in FIG. 2) via the rotation shaft 22. The diameter of the rotary table 2 is not particularly limited, but may be, for example, about 1000 mm when the diameter of the processing container 1 is 1100 mm.

The driving section 23 includes an encoder 25 that detects a rotation angle of the rotation shaft 22. The rotation angle of the rotation shaft 22 detected by the encoder 25 is transmitted to the controller 110 and is used in the controller 110 to determine the position of the wafer W mounted on each recess 24 on the rotary table 2.

A lower end of the rotation shaft 22, the driving section 23, and the encoder 25 are accommodated in a case 26. The case 26 is hermetically attached to the bottom 14 of the processing container 1. Additionally, a purge gas supply pipe 27 for supplying a purge gas to a lower region of the rotary table 2 is connected to the case 26.

The rotary table 2 has, for example, multiple (six in the present embodiment) circular recesses 24, on which the wafers W having a diameter of 300 mm can be mounted, on the surface of the rotary table 2 (see also FIG. 2). The multiple recesses 24 are provided at equal intervals along the rotation direction (clockwise in FIG. 2) of the rotary table 2. Each of the recesses 24 has an internal diameter (about 1 mm to 4 mm) slightly larger than the diameter of the wafer W. The depth of the recess 24 is set to the thickness of the wafer W or greater.

Multiple (for example, three) through-holes (not illustrated) through which multiple lift pins (not illustrated) pass are formed at the bottom surface of the recess 24. Each lift pin is provided at a transfer position of the wafer W in the vicinity of the transfer port 15, and is vertically moved by a lift mechanism (not illustrated). Each lift pin is raised to receive the wafer W after the transfer arm 10 holding the wafer W enters, and is lowered to mount the wafer W in the recess 24 after the transfer arm 10 retreats. Further, each of the lift pins raises the wafer W after the substrate processing and transfers the wafer W to the transfer arm 10 entering thereafter.

As illustrated in FIG. 2, in the substrate processing apparatus 100, multiple gas nozzles are disposed above the passage range of each recess 24. Each gas nozzle extends along a normal line of the rotation direction of the rotary table 2 and are provided spaced apart from each other in the circumferential direction of the processing container 1. In the present embodiment, the multiple gas nozzles are a first processing gas nozzle 31, a second processing gas nozzle 32, third processing gas nozzles 33 to 35, and separation gas nozzles 41 and 42.

The first processing gas nozzle 31, the second processing gas nozzle 32, the third processing gas nozzles 33 to 35, and the separation gas nozzles 41 and 42 are disposed in the processing chamber between the rotary table 2 and the top plate 11. Each of the first processing gas nozzle 31, the second processing gas nozzle 32, and the separation gas nozzles 41 and 42 extends linearly along the radial direction from the outer circumferential wall of the processing container 1 toward the central region C and is fixed in parallel with respect to the rotary table 2 (in the horizontal direction). In FIG. 2, the third processing gas nozzles 33 to 35, the separation gas nozzle 41, the first processing gas nozzle 31, the separation gas nozzle 42, and the second processing gas nozzle 32 are arranged in this order in a clockwise direction from the transfer port 15.

The first processing gas nozzle 31 has multiple gas holes (not illustrated) on the lower surface side of the first processing gas nozzle 31 (a side facing the rotary table 2), and discharges the first processing gas to a first processing region P1 located on a lower side of the processing chamber through the respective gas holes. The first processing gas nozzle 31 is connected to a supply source of the first processing gas via a flow rate control valve or an opening/closing valve outside the processing container 1 (both are not illustrated). When the SiON film is to be formed, the first processing gas nozzle 31 discharges, for example, a silicon-containing gas as the first processing gas to the wafer W.

A nozzle cover 40 is provided above the first processing gas nozzle 31. The nozzle cover 40 covers the upper side and both lateral sides of the first processing gas nozzle 31 to guide the first processing gas to flow along the wafer W and to guide the separation gas to flow toward the top plate 11 of the processing container 1 while preventing the separation gas from flowing toward the wafer W.

The second processing gas nozzle 32 has multiple gas holes on the lower surface side of the second processing gas nozzle 32 (a side facing the rotary table 2), and discharges the second processing gas to a second processing region P2 located on the lower side of the processing chamber through the respective gas holes. The second processing gas nozzle 32 is connected to a supply source of the second processing gas via a flow rate control valve or an opening/closing valve (both are not illustrated) outside the processing container 1. When the SiON film is to be formed, the second processing gas nozzle 32 discharges, for example, an oxygen-containing gas ($O_2$, $O_3$, a mixture thereof, or the like) as the second processing gas.

The third processing gas nozzles 33 to 35 discharge the third processing gas to a third processing region P3 of the processing chamber. Additionally, the third processing region P3 is a region where plasma processing is performed on the wafer W, and is hereinafter also referred to as a plasma processing region P3. A configuration of the plasma processing region P3 will be described in detail later.

The separation gas nozzles 41 and 42 form separation regions D1 and D2 that separate the third processing region P3 and the first processing region P1 and that separate the first processing region P1 and the second processing region P2. Each of the separation gas nozzles 41 and 42 has multiple gas holes on the lower surface side thereof (a side facing the rotary table 2), and the separation gas nozzles 41 and 42 discharge the separation gas such as an inert gas or a noble gas to the separation regions D1 and D2 through the respective gas holes. The separation gas nozzles 41 and 42 are connected to a separation gas supply source via a flow rate control valve or an opening/closing valve (both are not illustrated) outside the processing container 1.

A substantially fan-shaped protruding portion 4 is provided on the lower surface of the top plate 11 of the processing container 1 in the separation regions D1 and D2 (see FIG. 1). The protruding portion 4 has a groove (not illustrated) extending in the radial direction at a central portion in the circumferential direction, and each of the separation gas nozzles 41 and 42 is accommodated in the groove.

Referring back to FIG. 1, a protrusion 5, formed in a substantially annular shape along the circumferential direction so as to be continuous with a portion of the protruding portion 4 on the central region C side, is provided on the central portion of the lower surface of the top plate 11. The lower surface of the protrusion 5 is formed at the same height as the lower surface of the protruding portion 4. A labyrinth structure 51 is provided closer to the rotation center side of the rotary table 2 than the protrusion 5 and above the core 21 in order to suppress mixing of respective gases in the central region C.

Additionally, as illustrated in FIG. 1 and FIG. 2, the processing container 1 includes an annular side ring 18, serving as a cover body, at a position outside the rotary table 2 and below the rotary table 2. A groove-shaped gas flow path 18a through which gas can flow is formed in the side ring 18.

The side ring 18 has a first exhaust port 61 and a second exhaust port 62 on the upper surface of the side ring 18. The first exhaust port 61 is formed between the first processing gas nozzle 31 and the separation region D2. The second exhaust port 62 is formed between the plasma processing region P3 and the separation region D1. The first exhaust port 61 mainly exhausts the first processing gas and the separation gas, and the second exhaust port 62 mainly exhausts the third processing gas and the separation gas. As illustrated in FIG. 1, an exhaust pipe 63 is connected to the gas flow path 18a via an exhaust port of the bottom 14 of the processing container 1. A pressure regulator 64 such as a butterfly valve and a vacuum exhaust mechanism 65 such as a vacuum pump are connected to the exhaust pipe 63.

Further, the substrate processing apparatus 100 includes a heater 7 in a space between the bottom 14 of the processing container 1 and the rotary table 2. The heater 7 is accommodated in a cover body 71 supported by the protrusion 12a of the container body 12, and heats the wafer W on the rotary table 2, for example, at a temperature from a room temperature to about 700° C.

Additionally, the controller 110 of the substrate processing apparatus 100 may be a control computer including one or more processors 111, a memory 112, an input/output interface, an electronic circuit, and the like (both are not illustrated). The processor 111 is one or a combination of a central processing unit (CPU), a graphics processing unit (GPU), an application specific integrated circuit (ASIC), a field-programmable gate array (FPGA), a circuit including multiple discrete semiconductors, and the like. The memory 112 includes a volatile memory and a nonvolatile memory (for example, one or a combination of a compact disc, a digital versatile disc (DVD), a hard disk, a flash memory, and the like). The processor 111 reads and executes a program or a recipe such as a process condition stored in the memory 112 to operate the substrate processing apparatus 100 to perform a film deposition process.

Next, a configuration of the plasma processing region P3 of the substrate processing apparatus 100 will be described. As illustrated in FIG. 2, the substrate processing apparatus 100 includes a plasma source 80 that is positioned above the plasma processing region P3. The plasma source 80 is formed in a substantially fan shape in a plan view, and is installed to cover a diameter portion of the recess 24 (the wafer W) on the rotary table 2.

Figure 3:
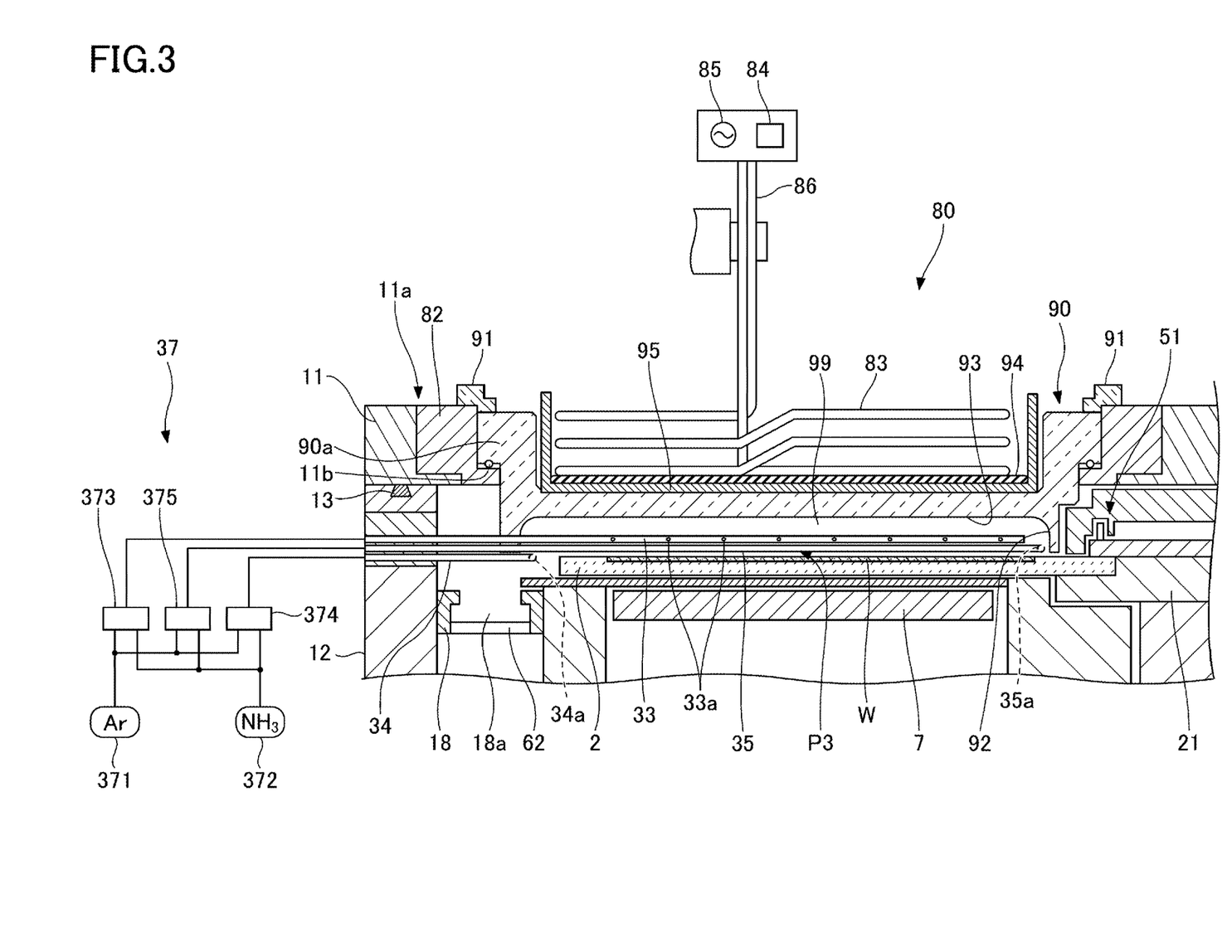
FIG. 3 is a schematic cross-sectional view illustrating a configuration of the substrate processing apparatus that forms a plasma processing region.
Figure 4:
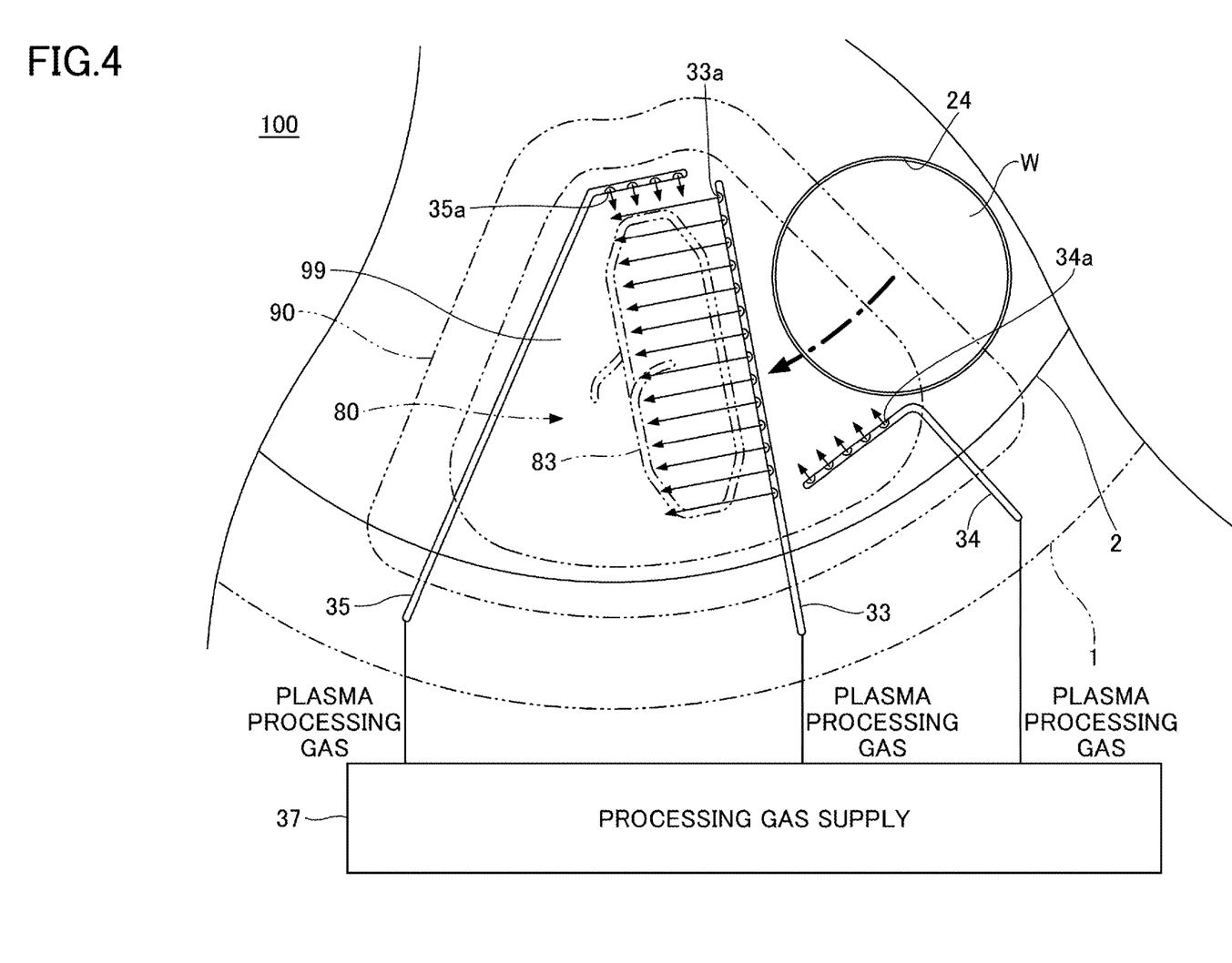
FIG. 4 is a schematic plan view illustrating the plasma processing region of the substrate processing apparatus.

FIG. 3 is a schematic cross-sectional view illustrating a configuration of the substrate processing apparatus 100 that forms the plasma processing region P3. FIG. 4 is a schematic plan view illustrating the plasma processing region P3 of the substrate processing apparatus 100. Here, in FIG. 4, for easy understanding of the drawing, the third processing gas nozzles 33 to 35 are indicated by solid lines, and the structures of the processing container 1 and the plasma source 80 are indicated by virtual lines (dashed-two dotted lines). As illustrated in FIG. 3 and FIG. 4, the plasma processing region P3 is configured in an inductively coupled plasma (ICP) apparatus in which a high-frequency wave is output from the plasma source 80 located above the processing container 1. A plasma processing space 99 in which the third processing gas discharged from the third processing gas nozzles 33 to 35 is converted into plasma is formed between the plasma source 80 and the rotary table 2 in the processing container 1.

The plasma source 80 includes an antenna 83 that forms an induction electric field in the plasma processing space 99. The antenna 83 is installed so as to be hermetically partitioned with respect to the inner region of the processing container 1. The antenna 83 has a flat coil shape along a rectangular shape of the plasma source 80 in a plan view (see also FIG. 2). As an example, the antenna 83 is formed by winding a metal wire or the like around the vertical axis multiple times (for example, three times).

The antenna 83 is connected to a high-frequency power supply 85 via a matching section 84 outside the processing container 1. Additionally, the plasma source 80 includes a connection electrode 86 for electrically connecting the antenna 83 to the matching section 84 and the high-frequency power supply 85. Here, the antenna 83 may have a vertically bendable configuration, a vertical movement mechanism that enables the antenna 83 to automatically vertically bend, a mechanism that enables a central portion of the rotary table 2 to be vertically move (both not illustrated), or the like as necessary.

An opening 11a having a substantially fan shape in a plan view is formed in the top plate 11 above the third processing gas nozzles 33 to 35 (see FIG. 3). In the plasma source 80, a housing 90 accommodating the antenna 83 is installed via an annular member 82 circulating along the edge of the opening 11a of the top plate 11. A seal member 11b such as an O-ring is provided between the annular member 82 and the housing 90. Additionally, the plasma source 80 is assembled to the processing container 1 by fixing a frameshaped pressing member 91 along a boundary between the annular member 82 and the housing 90 to the top plate 11 by fixing members such as bolts in a state in which the annular member 82 and the housing 90 are fitted into the opening 11*a*. With this configuration, the top side of the plasma processing space 99 is hermetically closed.

The housing 90 according to the present embodiment is a quartz portion formed of quartz, and the antenna 83 is positioned below the top plate 11. The housing 90 is formed in a recessed box shape in a cross-sectional view in which a peripheral edge on the upper side has a flange 90*a* protruding along a circumferential direction and a central portion on the lower side is recessed toward an inner region of the processing container 1. The housing 90 is disposed to cover the wafer W in the radial direction of the rotary table 2 when the wafer W is positioned below the housing 90. A lower surface of the housing 90 is a facing surface 93 facing the rotary table 2 in the plasma processing space 99.

A Faraday shield 95 and an insulating plate 94 are stacked in the housing 90 on the opposite side of the facing surface 93. The Faraday shield 95 is formed of a conductive plate (a metal plate). The insulating plate 94 ensures insulation between the Faraday shield 95 and the antenna 83, and is formed of quartz or the like.

The housing 90 has a protrusion 92 protruding downward from the facing surface 93 toward the rotary table 2. The protrusion 92 surrounds the plasma processing space 99 on the lower side of the housing 90 along the circumferential direction. The third processing gas nozzles 33 to 35 are disposed in the plasma processing space 99 surrounded by the facing surface 93 of the housing 90, the inner circumferential surface of the protrusion 92, and the upper surface of the rotary table 2. Here, the protrusions 92 positioned at the base end (the inner wall side of the processing container 1) of the third processing gas nozzles 33 to 35 are notched along the outer shapes of the third processing gas nozzles 33 to 35.

The third processing gas nozzles 33 to 35 discharge the plasma processing gas as the third processing gas in conjunction with the plasma source 80. This causes plasma to be generated in the plasma processing space 99. The third processing gas nozzles 33 to 35 discharge a noble gas, a nitrogen-containing gas, and the like for plasma generation, singly or in combination. Examples of the noble gas include an argon (Ar) gas and a helium (He) gas. Examples of the nitrogen-containing gas include an ammonia ($NH_3$) gas. Here, the third processing gas nozzles 33 to 35 may be configured to discharge another gas (for example, an oxygen-containing gas such as $O_2$ or $O_3$, or a hydrogen-containing gas such as $H_2$) in addition to the noble gas and the nitrogen-containing gas.

Specifically, the third processing gas nozzles 33 to 35 include a base nozzle 33, an outer nozzle 34, and a shaft-side nozzle 35 (see FIG. 4). The base nozzle 33 is a gas nozzle configured to supply the plasma processing gas to the entire surface of the wafer W, and is disposed in the plasma processing space 99 on the upstream side of the rotation direction of the rotary table 2 (at a position near the protrusion 92). The base nozzle 33 linearly extends along the radial direction of the rotary table 2 and reaches the vicinity of the central region C of the processing container 1.

The base nozzle 33 has multiple gas holes 33*a* facing the downstream side in the rotation direction of the rotary table 2. The gas holes 33*a* are arranged at equal intervals along the longitudinal direction of the base nozzle 33 in the installation position of the plasma source 80 (below the facing surface 93). Each of the gas holes 33*a* discharges the plasma processing gas in parallel to the surface direction (the horizontal direction) of the facing surface 93 of the plasma source 80. Alternatively, the multiple gas holes 33*a* may be formed to be inclined obliquely downward (toward the rotary table 2) with respect to the horizontal direction and configured to discharge the plasma processing gas toward the rotary table 2.

The outer nozzle 34 is a nozzle for intensively supplying the plasma processing gas to the outer region of the wafer W, and is provided in the vicinity of the upstream side of the rotary table 2 in the rotation direction in the plasma processing space 99. The outer nozzle 34 includes a radial portion that shortly extends from the outer circumferential wall of the processing container 1 toward the central region C, and an outer portion that is bent near the outer circumferential wall and that linearly extends clockwise. The outer portion of the outer nozzle 34 has one or more gas holes 34*a*. For example, the multiple gas holes 34*a* are formed to face the central region C and face obliquely downward (the rotary table 2 side).

The shaft-side nozzle 35 is a nozzle for intensively supplying the plasma processing gas to the wafer W near the central region C of the processing container 1, and is provided in the vicinity of the downstream side of the rotary table 2 in the rotation direction in the plasma processing space 99. The shaft-side nozzle 35 includes a radial portion that extends in the radial direction from the outer circumferential wall of the processing container 1 toward the central region C and a shaft-side portion that is bent in the vicinity of the central region C and that linearly extends counterclockwise (in a direction opposite to the rotational direction of the rotary table 2). The shaft-side portion of the shaft-side nozzle 35 has one or more gas holes 35*a*. For example, the multiple gas holes 35*a* are formed to face the outer circumferential wall of the processing container 1 and to face obliquely downward (toward the rotary table 2).

The flow rate (the supply amount) of the Ar gas and the flow rate (the supply amount) of the $NH_3$ gas, which constitutes the plasma processing gas, may be different from each other in each of the base nozzle 33, the outer nozzle 34, and the shaft-side nozzle 35. For example, the substrate processing apparatus 100 may be configured to supply the $NH_3$ gas from the base nozzle 33 and the outer nozzle 34 but to supply no $NH_3$ gas from the shaft-side nozzle 35. Here, the base nozzle 33, the outer nozzle 34, and the shaft-side nozzle 35 may be configured to discharge the gas at the same flow rate. The substrate processing apparatus 100 may be configured to include one or none of the outer nozzle 34 and the shaft-side nozzle 35.

Additionally, the third processing gas nozzles 33 to 35 are connected to a processing gas supply 37 outside the processing container 1 (see FIG. 3). For example, in order to supply the plasma processing gas, the processing gas supply 37 includes an Ar gas source 371, an $NH_3$ gas source 372, a base nozzle buffer 373, an outer nozzle buffer 374, and a shaft-side nozzle buffer 375. A flow rate controller, an opening/closing valve, and the like, which are not illustrated, are provided between the Ar gas source 371 and the $NH_3$ gas source 372; and the base nozzle buffer 373, the outer nozzle buffer 374, and the shaft-side nozzle buffer 375.

The base nozzle buffer 373 mixes the Ar gas of the Ar gas source 371, the $NH_3$ gas of the $NH_3$ gas source 372, and the like at an appropriate flow rate ratio, and supplies the mixture to the base nozzle 33. The outer nozzle buffer 374 mixes the Ar gas of the Ar gas source 371, the $NH_3$ gas of the $NH_3$ gas source 372, and the like at an appropriate flow rate ratio and supplies the mixture to the outer nozzle 34.

The shaft-side nozzle buffer 375 mixes the Ar gas of the Ar gas source 371, the NH$_3$ gas of the NH$_3$ gas source 372, and the like at an appropriate flow rate ratio and supplies the mixture to the shaft-side nozzle 35.

Figure 5:
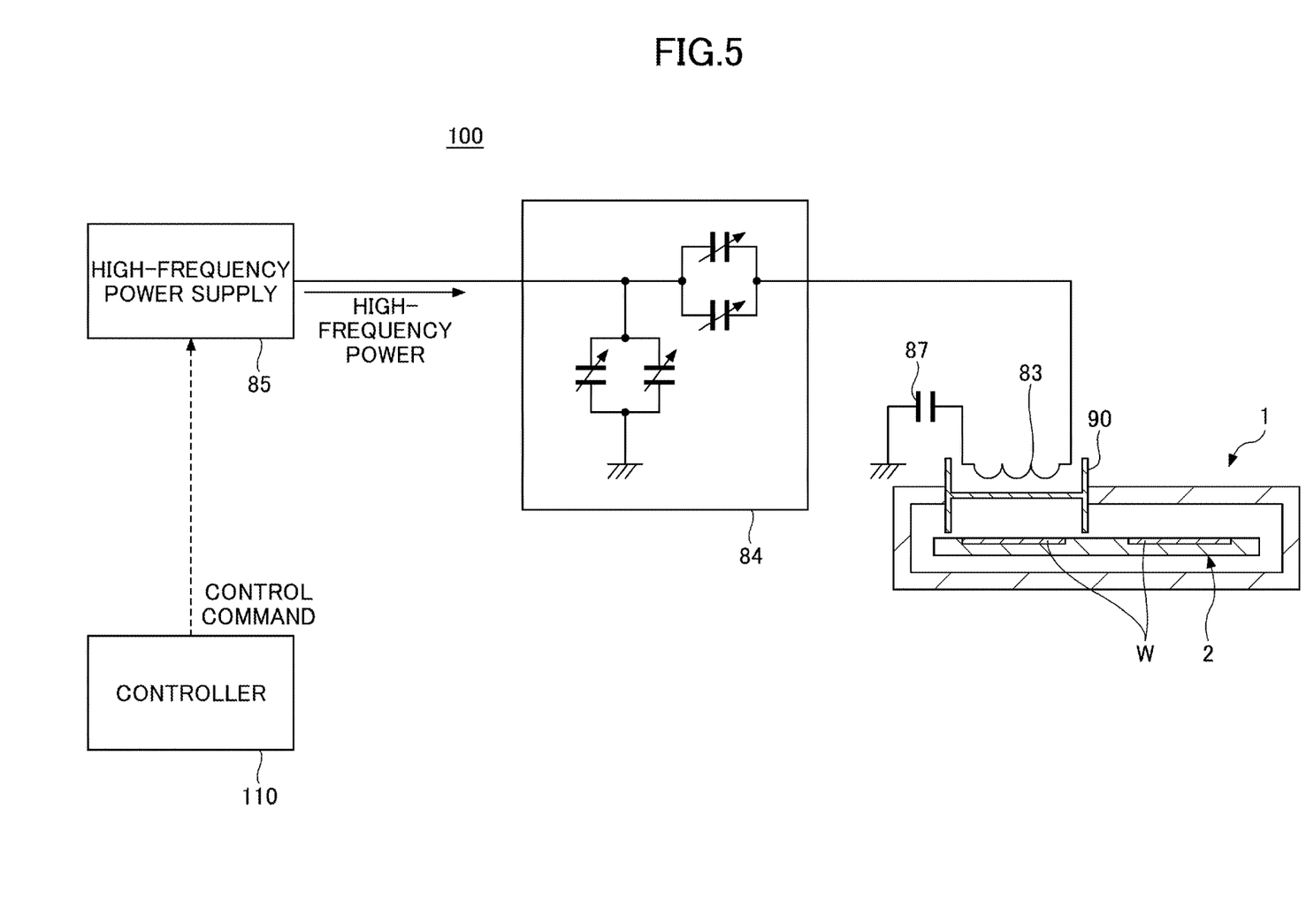
FIG. 5 is an explanatory diagram schematically illustrating a power supply circuit that supplies high-frequency power.

FIG. 5 is an explanatory diagram schematically illustrating a power supply circuit that supplies high-frequency power. As illustrated in FIG. 5, in the substrate processing apparatus 100, a high-frequency power supply 85, a matching section 84, the antenna 83, and a blocking capacitor 87 are connected in series in order from the power supply side to the ground side. The matching section 84 includes multiple variable capacitors and/or inductors inside, and performs impedance matching when an induction electric field is formed by the antenna 83.

The high-frequency power supply 85 is an oscillation device that can output high-frequency power having a frequency of 13.56 MHz and an output value of 500 W to 5 kW (5000 W). Additionally, the high-frequency power supply 85 is configured to output a continuous wave and a pulse wave of high-frequency power. In particular, in the output of the pulse wave of the high-frequency power, the high-frequency power supply 85 may be configured to adjust the duty cycle over a range of 10% to 99.9%.

The high-frequency power supply 85 is communicably connected to the controller 110, and outputs, to the antenna 83, high-frequency power adjusted based on a control command transmitted from the controller 110. The control command includes, for example, information such as the output value of the high-frequency power, the duty cycle of the pulse wave, the output timing of the continuous wave or the pulse wave, and the like. This allows the controller 110 of the substrate processing apparatus 100 to appropriately control the induced electric field in the plasma processing space 99.

Figure 6A:
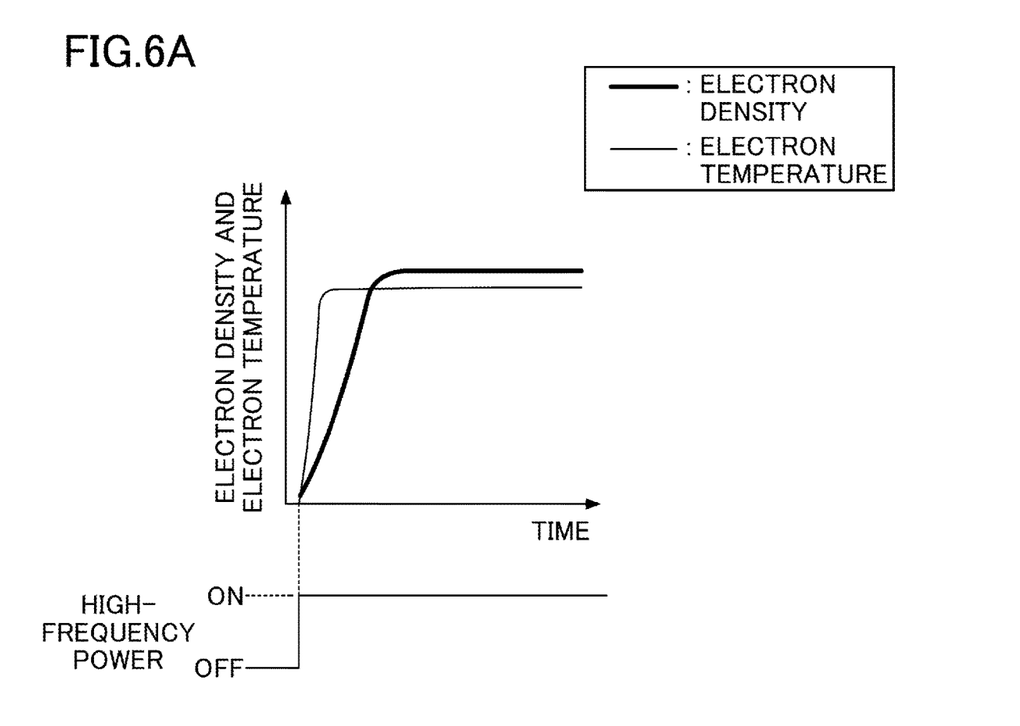
FIG. 6A is a graph illustrating an example of states of an electron density and an electron temperature of plasma generated in a plasma processing space by the plasma processing method.
Figure 6B:
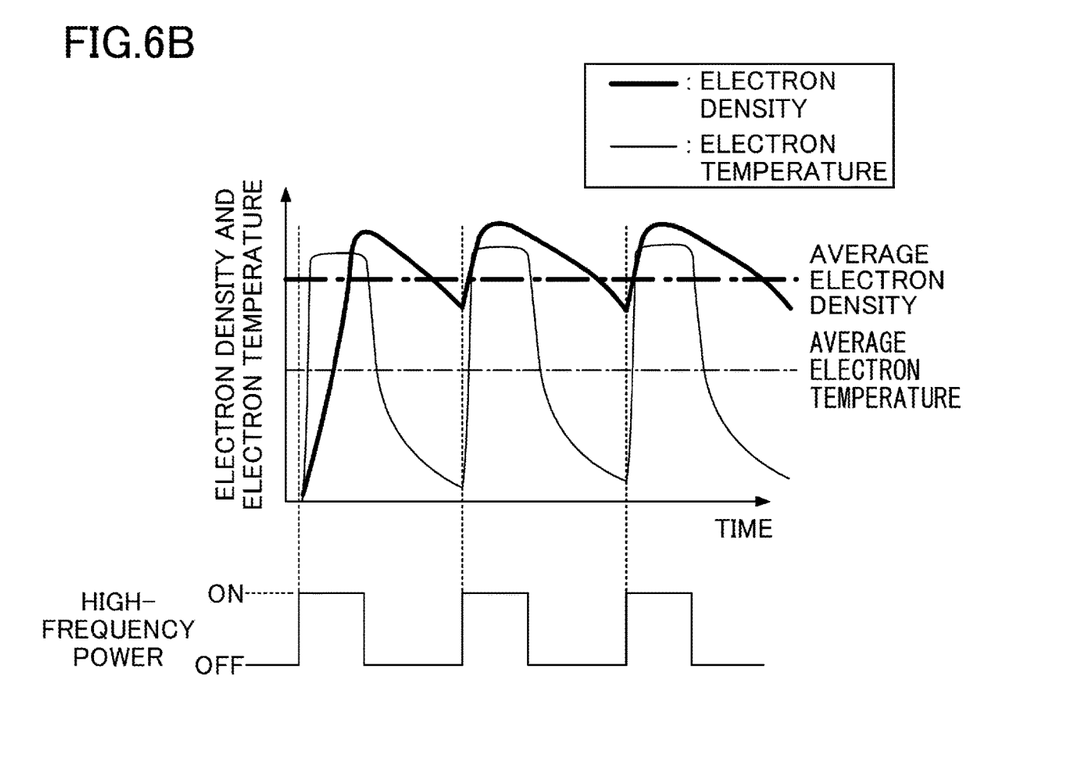
FIG. 6B is a graph illustrating an example of states of the electron density and the electron temperature of plasma generated in the plasma processing space by the plasma processing method.

The substrate processing apparatus 100 described above is configured to output the pulse wave of the high-frequency power from the high-frequency power supply 85 during a time period in which the plasma processing is actually performed on the wafer W in the film deposition processing. In the following, the significance of outputting the pulse wave from the high-frequency power supply 85 will be described with reference to FIG. 6A and FIG. 6B. FIG. 6A and FIG. 6B are graphs indicating states of the electron density and the electron temperature of plasma generated in the plasma processing space 99 by the plasma processing method. FIG. 6A depicts a case where the continuous wave is supplied, and FIG. 6B depicts a case where the pulse wave is supplied.

As illustrated in FIG. 6A, in the plasma processing space 99, the electron density (Ne) and the electron temperature (Te) of the plasma change in accordance with the high-frequency power supplied to the antenna 83. Specifically, when the continuous wave is output from the high-frequency power supply 85 to the antenna 83, as the high-frequency power rises from 0 (OFF) to a predetermined output value (for example, 4 kW: ON), the electronic density (Ne) and the electronic temperature (Te) in the plasma processing space 99 increase. At this time, the electron temperature (Te) rapidly rises substantially in conjunction with the switching of the high-frequency power from OFF to ON. The electrons in the plasma easily receive energy from the induced electric field, and even if electrons collide with other particles, energy loss is small. Therefore, the electron temperature (Te) easily follows the change in the high-frequency power. With respect to the above, the electron density (Ne) increases based on ionization of the plasma processing gas in the plasma, so that the rising of the electron density (Ne) is delayed with respect to the rising of the high-frequency power.

Here, when the electron temperature is high, electrons in the plasma collide with nitrogen (N) to generate active species of nitrogen. When the active species of nitrogen collide with the housing 90 (the quartz), the quartz is damaged, and it becomes a factor of generating particles. However, when the output of the high-frequency power is lowered to suppress the electron temperature, the ionization of the plasma processing gas is also reduced. In order to suppress generation of particles due to damage to the quartz, it is necessary to lower the electron temperature while keeping the electron density high.

As illustrated in FIG. 6B, when the pulse wave, in which the high-frequency power is repeatedly turned on and off, is output, the electron density (Ne) and the electron temperature (Te) decrease when the high-frequency power is turned off. However, the electron temperature (Te) rapidly decreases when the induction electric field disappears as the high-frequency power is turned off. With respect to the above, the electron density (Ne) decreases at a much smaller decay rate than the decay rate of the electron temperature (Te). Therefore, by using the decay difference between the electron temperature (Te) and the electron density (Ne) when the high-frequency power is turned off, the electron temperature can be reduced while the electron density is maintained.

In detail, due to the pulse wave of the high-frequency power, the electron temperature (Te) repeats a large amplitude, and the average electron temperature (average Te) decreases. With respect to the above, due to the pulse wave of the high-frequency power, the electron density (Ne) gradually decreases from a high density state to repeat a small amplitude, and the average electron density (average Ne) can maintain a high state. Therefore, the substrate processing apparatus 100 significantly decreases the average electron temperature relative to the average electron density by the pulse wave of the high-frequency power, thereby suppressing generation of particles due to the damage of the quartz.

In order to accurately control the average electron density and the average electron temperature in the plasma processing space 99, the controller 110 of the substrate processing apparatus 100 instructs the duty cycle of the high-frequency power supplied from the high-frequency power supply 85 to output the pulse wave. The duty cycle of the pulse wave of the high-frequency power can be obtained by the following equation (1).

$$\text{Duty cycle} = T_{ON}/(T_{ON}+T_{OFF})$$

Here, $T_{ON}$ is an ON time period of the high-frequency power, and $T_{OFF}$ is an OFF time period of the high-frequency power.

The controller 110 can set the duty cycle of the pulse wave of the high-frequency power in a range of 10% to 99.9%, but preferably set the duty cycle in a range of 66.7% to 99.9% as the actual duty cycle of the pulse wave. When the duty cycle of the pulse wave is less than 66.7%, the decay of the electron temperature (Te) decreases while the decay of the electron density (Ne) increases, so that the average electron density is likely to decrease.

With respect to the above, when the duty cycle of the pulse wave is 66.7% or greater, the high-frequency power is turned on at a stage where the decrease in the electron density (Ne) is small while the electron temperature (Te) greatly decreases. Therefore, the average electron density can be maintained at a sufficiently high value. Here, the controller 110 may be configured to instruct not only the duty cycle of the pulse wave but also the ON time period $T_{ON}$ and the OFF time period $T_{OFF}$. The duty cycle, the ON time period $T_{ON}$, and the OFF time period $T_{OFF}$ may be set by a user.

The substrate processing apparatus 100 according to the present embodiment is basically configured as described above, and the operation (the film deposition process) of the substrate processing apparatus 100 will be described below.

Figure 7A:
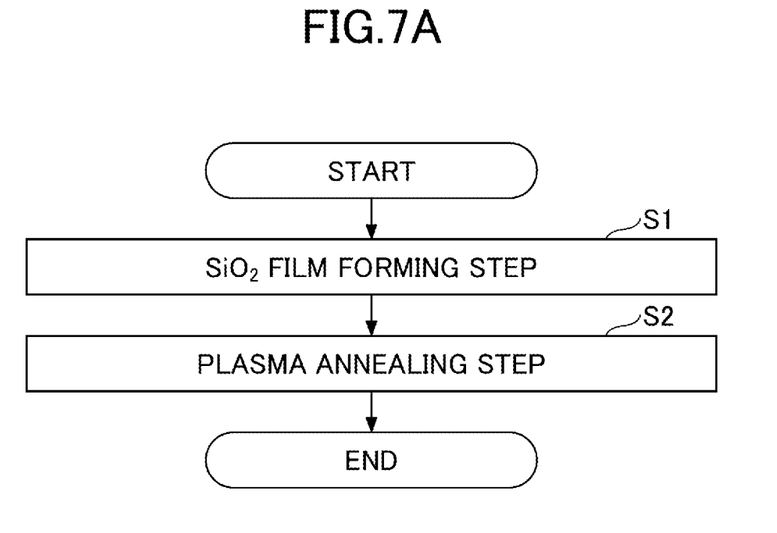
FIG. 7A is a flowchart illustrating a process of depositing a SiON film.
Figure 7B:
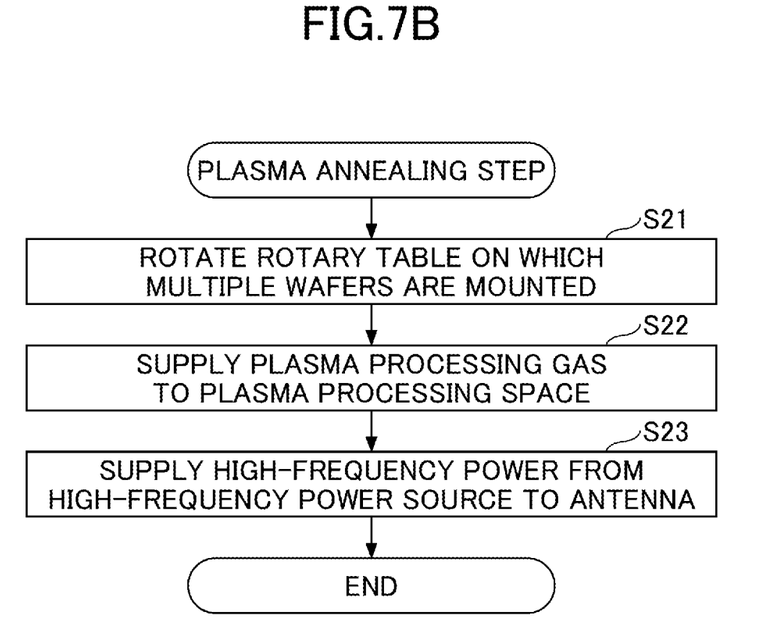
FIG. 7B is a flowchart illustrating the process of depositing the SiON film.

FIG. 7A and FIG. 7B are flowcharts illustrating a process of depositing a SiON film. FIG. 7A is a flowchart illustrating each step of the film deposition process, and FIG. 7B is a flowchart illustrating a plasma processing method in a plasma annealing step S2. After the controller 110 of the substrate processing apparatus 100 mounts the wafer W in each recess 24 of the rotary table 2 in the processing container 1, the controller 110 sequentially performs a SiO$_2$ film deposition step S1 and the plasma annealing step S2 as the substrate processing method, as illustrated in FIG. 7A.

In the SiO$_2$ film deposition step S1, the controller 110 controls the heater 7 to heat the wafer W to a predetermined temperature while rotating the rotary table 2 in a state where the inside of the processing container 1 is controlled to a predetermined pressure by the pressure regulator 64 and the vacuum exhaust mechanism 65. At this time, the controller 110 supplies the separation gas (for example, the Ar gas) from the separation gas nozzles 41 and 42.

Additionally, the controller 110 supplies the silicon-containing gas as the first processing gas from the first processing gas nozzle 31. This causes the silicon-containing gas to adhere to the surface of the wafers W in the first processing region P1.

Further, the controller 110 supplies the oxygen-containing gas as the second processing gas from the second processing gas nozzle 32. This causes the silicon-containing gas on the wafer W moved along with the rotation of the rotary table 2 to react with the oxygen-containing gas in the second processing region P2. Thus, a molecular layer of the SiO$_2$, which is a thin film, is formed and deposited on the wafer W.

Then, the controller 110 continues the rotation of the rotary table 2 to repeat the adhesion of the silicon-containing gas to the surface of the wafer W and the reaction between the silicon-containing gas and the oxygen-containing gas. As a result, the SiO$_2$ film having a desired thickness is formed on the surface of the wafer W. When the film thickness of the SiO$_2$ film reaches the desired thickness, the controller 110 ends the SiO$_2$ film deposition step S1.

Next, in the plasma annealing step S2, the controller 110 performs the plasma processing on each wafer W in the plasma processing region P3 of the processing container 1. As illustrated in FIG. 7B, the controller 110 rotates the rotary table 2 on which each wafer W is mounted in a state where the inside of the processing container 1 is controlled to be a predetermined pressure by the pressure regulator 64 and the vacuum exhaust mechanism 65 (step S21). Additionally, at this time, the controller 110 controls the heater 7 to heat the wafer W to a predetermined temperature and controls to supply the separation gas from the separation gas nozzles 41 and 42.

Then, the controller 110 controls the processing gas supply 37 to perform a gas supplying step of supplying the plasma processing gas (the Ar gas and NH$_3$ gas) from the third processing gas nozzles 33 to 35 to the plasma processing space 99 (step S22). Further, in a state in which the gas supply is continued, the controller 110 performs a power supply process of supplying the high-frequency power from the high-frequency power supply 85 to the antenna 83 to generate plasma in the plasma processing space 99 (step S23). The SiO$_2$ film deposited on the wafer W is modified by the plasma in the plasma processing space 99, thereby generating the SiON film.

Figure 8:
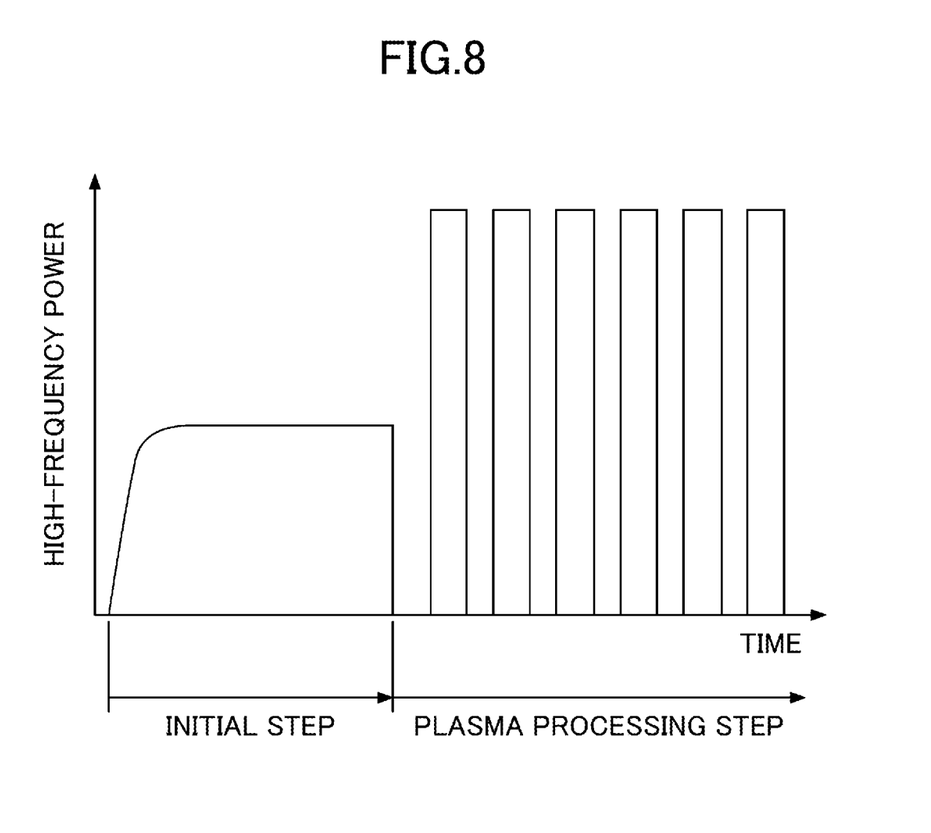
FIG. 8 is a timing chart illustrating an example of supplying the high-frequency power in a power supplying step.

FIG. 8 is a timing chart illustrating an example of supplying the high-frequency power in the power supply step. As illustrated in FIG. 8, in the power supply process, the controller 110 first performs an initial step of supplying the continuous wave of high-frequency power from the high-frequency power supply 85 to the antenna 83. This excites the Ar gas in the plasma processing space 99 to rapidly ignite the plasma. The high-frequency power in the initial step of supplying the continuous wave may be set to, for example, 2 kW. The high-frequency power in the initial step is low, so that the substrate processing apparatus 100 can suppress damage to the quartz forming the housing 90.

When the time point at which the plasma is stably generated in the plasma processing space 99 is reached, the controller 110 proceeds to the plasma processing step of causing the high-frequency power supply 85 to supply a high-frequency pulse wave while continuing the supply of the plasma processing gas. The output value of the high-frequency power in the plasma processing step is preferably set to 1.5 times or greater than the output value of the high-frequency power in the initial step. For example, in FIG. 8, the controller 110 sets the output value of the high-frequency power in the plasma processing step to 4 kW, which is twice the output value in the initial step. As a result, the substrate processing apparatus 100 may efficiently perform the plasma processing on each wafer W even when the pulse wave of the high-frequency power is supplied.

By performing the above-described power supply process, the substrate processing apparatus 100 can reduce the average electron temperature while maintaining the average electron density of the plasma in the plasma processing space 99. Specifically, by maintaining the high average electronic density, the plasma processing can be performed on the SiO$_2$ film deposited on the wafer W and the SiO$_2$ film can be smoothly modified into the SION film. With respect to the above, in the substrate processing apparatus 100, the average electron temperature is low to reduce damage to the quartz, so that generation of particles due to the damage to the quartz can be suppressed.

Returning back to FIG. 7A, when the above plasma annealing step S2 is completed, the controller 110 of the substrate processing apparatus 100 controls the processing gas supply 37 to stop the supply of the plasma processing gas and to stop the supply of the high-frequency power to the plasma source 80. Subsequently, the controller 110 unloads the processed wafer W from the processing container 1 and ends the film deposition process. Here, in the above-described substrate processing method according to the embodiment, the SiO$_2$ film deposition step S1 and the plasma annealing step S2 are sequentially performed once. However, the present invention is not limited thereto, and the SiO$_2$ film deposition step S1 and the plasma annealing step S2 may be alternately repeated multiple times. Additionally, in the substrate processing method, while rotating each wafer W, the supply of the silicon-containing gas in the first processing region P1, the supply of the oxygen-containing gas in the second processing region P2, and the modification by the plasma in the plasma processing region P3 may be simultaneously performed.

EXAMPLES

Figure 9:
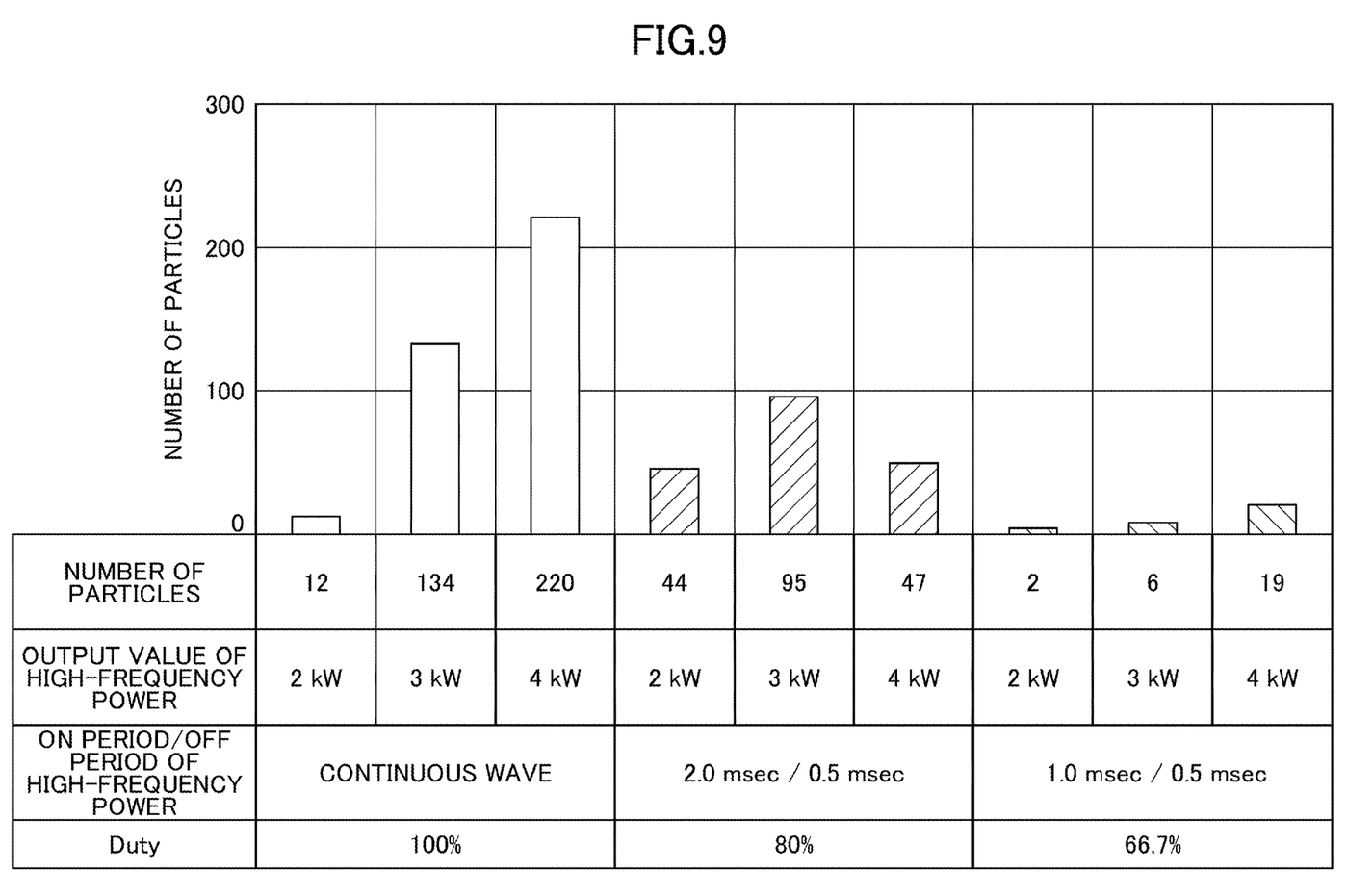
FIG. 9 is a graph and a table that compare the numbers of particles generated on a wafer when changing a condition of outputting high-frequency power from a high-frequency power supply in a plasma processing step.

An experiment was conducted to confirm the effect of the plasma processing method described above. FIG. 9 is a graph and a table that compare the numbers of particles generated on the wafer W by changing the condition of the high-frequency power output from the high-frequency power supply 85 in the plasma processing step.

In the bar graph of FIG. 9, the horizontal axis represents each pattern of the high-frequency power condition, and the vertical axis represents the number of particles generated on the wafer W by the plasma processing. In this experiment, as the process condition, the wafer W was heated at 400° C. and the pressure inside the processing container 1 was adjusted to 1.5 Torr (200 Pa). Additionally, the plasma processing method was performed in a state in which the wafer W was disposed in the plasma processing space 99 as a state in which the rotation of the wafer W by the rotary table 2 was stopped. The plasma processing gas supplied to the plasma processing space 99 is the Ar gas and the $NH_3$ gas.

As can be found from the experimental results illustrated in FIG. 9, when the continuous wave of the high-frequency power is supplied, the number of particles generated on the wafer W increases. In particular, when the high-frequency power is 3 kW or 4 kW, the number of particles is greatly increased. In the substrate processing apparatus 100 in which the plasma processing method is performed while the wafer W is rotated by the rotary table 2, the processing rate is improved by setting the power value of the high-frequency power to a high value, but it becomes a problem that the number of particles increases at a power value of a 3 kW or a 4 kW.

With respect to the above, when the pulse wave of the high-frequency power is supplied, the number of particles is reduced in comparison with the case where the continuous wave is supplied. Thus, it can be said that damage to the quartz is reduced by supplying the pulse wave of the high-frequency power, thereby suppressing generation of particles. In particular, it is found that when the ON time period $T_{ON}$ of the pulse wave is 1 msec and the OFF time period $T_{OFF}$ of the pulse wave is 0.5 msec (when the duty cycle is 66.7%), generation of particles is sufficiently suppressed. It can be presumed that the time period in which the electron temperature (Te) of the plasma is high is shortened by shortening the ON time period $T_{ON}$, thereby reducing damage caused to the quartz by the active species of N. Therefore, it can be said that the plasma processing method can achieve the plasma processing in which generation of particles is suppressed by appropriately setting the ON time period $T_{ON}$ and the OFF time period $T_{OFF}$ of the pulse wave of the high-frequency power.

The substrate processing apparatus 100 and the plasma processing method of the present disclosure are not limited to the above-described embodiments, but may encompass various modified examples. For example, although the substrate processing apparatus 100 that performs the plasma processing method while rotating multiple wafers W by the rotary table 2 has been described in the above-described embodiment, the plasma processing method of the present disclosure may be applied to a substrate processing apparatus in which one wafer W is mounted on a mounting stage, which is not illustrated.

The plasma processing method may be configured to change an output value of the high-frequency power in the plasma processing step of supplying the pulse wave of the high-frequency power. For example, by gradually increasing the high-frequency power at the time of starting the supply of the pulse wave, a local increase in electron density or electron temperature and the like can be suppressed. As described above, because the high-frequency power supply 85 is configured to adjust the high-frequency power in the range of 500 W to 5 kW, the high-frequency power can be output at an appropriate output value according to the situation.

Additionally, the plasma processing method may be configured to immediately output the pulse wave without outputting the continuous wave of the high-frequency power in the plasma annealing step. In this case, plasma can be also ignited in the plasma processing space 99 by the high-frequency power in the pulse wave.

The technical idea and effects of the present disclosure described in the above embodiments will be described below.

A first embodiment of the present disclosure is the plasma processing method of depositing the nitride film on the substrate (the wafer W) by using plasma, and the plasma processing method includes (a) supplying the plasma processing gas that includes a nitrogen-containing gas to the plasma processing space 99 inside the processing container 1 and (b) supplying high-frequency power from the high-frequency power supply 85 to the antenna 83 disposed on the quartz portion (the housing 90) exposed to the plasma processing space 99 to generate the plasma in the plasma processing space 99 at the time of performing (a). In (b), by supplying, to the antenna 83, a pulse wave of the high-frequency power that repeats on and off, the average electron temperature of the plasma is lowered relative to the average electron density of the plasma.

In the above-described plasma processing method, by supplying the pulse wave of the high-frequency power when depositing the nitride film by using plasma, generation of active species of nitrogen due to ionized electrons can be suppressed. That is, the plasma processing method can lower the average electron temperature while maintaining the average electron density by supplying the pulse wave. Therefore, damage to the quartz portion (the housing 90) caused by nitrogen becoming active species due to the influence of the high electron temperature can be suppressed. As a result, the plasma processing method can significantly reduce generation of particles due to fragmenting of the quartz.

Additionally, in (b), the duty cycle of the pulse wave may be set in a range of 66.7% to 99.9%. This allows the plasma processing method to sufficiently reduce the average electron temperature while maintaining the average electron density.

Additionally, in (b), the high-frequency power may be supplied in a range of 500 W to 5000 W. This allows the plasma processing method to stably generate the plasma in the plasma processing space 99 even when the pulse wave of the high-frequency power is supplied.

Additionally, (b) may include a step of supplying a continuous wave of the high-frequency power from the high-frequency power supply 85 before the step of supplying the pulse wave, and the output value of the high-frequency power in the step of supplying the pulse wave may be larger than the output value of the high-frequency power in the step of supplying the continuous wave. As described above, by supplying the pulse wave after igniting the plasma by the continuous wave of the high-frequency power, the plasma processing method can significantly reduce the number of particles while satisfactorily generating the plasma.

Additionally, the output value of the high-frequency power in the step of supplying the pulse wave may be 1.5 times or greater than the output value of the high-frequency power in the step of supplying the continuous wave. This allows the plasma processing method to suppress damage to the quartz portion (the housing 90) in the step of supplying the continuous wave, and to efficiently perform the plasma processing in the step of supplying the pulse wave.

Additionally, in (a) and (b), the rotary table 2, on which multiple substrates (the wafers W) provided in the processing container 1 are mounted, may be rotated. This allows the plasma processing method to stably perform the plasma processing on each substrate while reducing the number of particles, even when the nitride film is deposited while the multiple substrates are rotated.

A second embodiment according to the present disclosure is a substrate processing apparatus 100 that deposits the nitride film on the substrate (the wafer W) by using plasma. The substrate processing apparatus 100 includes the processing container 1 that accommodates the substrate, the processing gas nozzle (third processing gas nozzles 33 to 35) configured to supply the plasma processing gas that includes the nitrogen-containing gas to the plasma processing space 99 inside the processing container 1, the plasma source 80 configured to generate the plasma in the plasma processing space 99 with the antenna 83 being disposed on the quartz portion (the housing 90) exposed to the plasma processing space 99, and the high-frequency power supply 85 configured to supply the high-frequency power to the antenna 83 at the time of supplying the plasma processing gas from the processing gas nozzle to the plasma processing space 99. The high-frequency power supply 85 supplies, to the antenna 83, the pulse wave of the high-frequency power that repeats on and off, thereby lowering the average electron temperature of the plasma relative to the average electron density of the plasma. In this case, the substrate processing apparatus 100 can suppress generation of active species of nitrogen when depositing the nitride film by generating the plasma.

The plasma processing method according to the embodiment disclosed here is illustrative in all respects and is not restrictive. The embodiments can be modified and improved in various forms without departing from the scope and spirit of the appended claims. The matters described in the multiple embodiments can also take other configurations as long as there is no contradiction, and can be combined as long as there is no contradiction.

The plasma processing method of the present disclosure may be applied to apparatuses such as a capacitively coupled plasma (CCP), a radial line slot antenna (RLSA), an electron cyclotron resonance plasma (ECR), and a helicon wave plasma (HWP), in addition to the ICP.

According to one aspect, when generating plasma to deposit a nitride film, generation of active species of nitrogen can be suppressed.

What is claimed is:

1. A plasma processing method of depositing a nitride film on a substrate by using plasma, the plasma processing method comprising:
   (a) supplying a plasma processing gas that includes a nitrogen-containing gas to a plasma processing space inside a processing container; and
   (b) supplying high-frequency power from a high-frequency power supply to an antenna disposed on a quartz portion exposed to the plasma processing space to generate the plasma in the plasma processing space at a time of performing (a),
   wherein (b) includes supplying a pulse wave of the high-frequency power to the antenna, the pulse wave repeating on and off,
   wherein (b) includes supplying a continuous wave of the high-frequency power from the high-frequency power supply to the antenna before supplying the pulse wave, and
   wherein an output value of the high-frequency power in the supplying of the pulse wave is larger than an output value of the high-frequency power in the supplying of the continuous wave.

2. The plasma processing method as claimed in claim 1, wherein a duty cycle of the pulse wave is set to a range from 66.7% to 99.9% in (b).

3. The plasma processing method as claimed in claim 1, wherein the high-frequency power is supplied in a range from 500 W to 5000 W in (b).

4. The plasma processing method as claimed in claim 1, wherein the output value of the high-frequency power in the supplying of the pulse wave is 1.5 times or greater than the output value of the high-frequency power in the supplying of the continuous wave.

5. The plasma processing method as claimed in claim 1, wherein a rotary table on which a plurality of said substrates are mounted inside the processing container is rotated in (a) and (b).

* * * * *